(12) United States Patent
Ballweg et al.

(10) Patent No.: US 8,089,540 B2
(45) Date of Patent: Jan. 3, 2012

(54) METHOD FOR ACQUIRING DATA BY MEANS OF AN IMAGE SENSOR

(75) Inventors: Christof Ballweg, VS-Villingen (DE); Joachim Knittel, Tuttlingen (DE)

(73) Assignee: Thomson Licensing, Boulogne Billancourt (FR)

( * ) Notice: Subject to any disclaimer, the term of this patent is extended or adjusted under 35 U.S.C. 154(b) by 432 days.

(21) Appl. No.: 11/585,470

(22) Filed: Oct. 24, 2006

(65) Prior Publication Data
US 2007/0091186 A1 Apr. 26, 2007

(30) Foreign Application Priority Data

Oct. 26, 2005 (EP) .................................. 05109991

(51) Int. Cl.
*H04N 5/335* (2011.01)
*H04N 3/28* (2006.01)
*H04N 9/68* (2006.01)
*H04N 5/235* (2006.01)
(52) U.S. Cl. ...... 348/294; 348/206; 348/235; 348/230.1
(58) Field of Classification Search .................. 348/294, 348/206, 235, 230.1
See application file for complete search history.

(56) References Cited

U.S. PATENT DOCUMENTS

| | | | |
|---|---|---|---|
| 5,519,651 A * | 5/1996 | Redfield | 365/125 |
| 5,920,536 A | 7/1999 | Campbell et al. | |
| 6,414,763 B1 * | 7/2002 | Hesselink et al. | 359/21 |
| 7,088,482 B2 * | 8/2006 | Edwards | 359/11 |
| 7,184,383 B2 * | 2/2007 | Ayres et al. | 369/109.01 |
| 7,436,749 B2 * | 10/2008 | Yamatsu | 369/103 |
| 2002/0156559 A1 * | 10/2002 | Stam et al. | 701/36 |
| 2003/0160250 A1 | 8/2003 | Cova et al. | |
| 2004/0017497 A1 * | 1/2004 | Suzuki et al. | 348/315 |
| 2005/0007460 A1 * | 1/2005 | Stavely et al. | 348/222.1 |

(Continued)

FOREIGN PATENT DOCUMENTS
DE 43 30 794 A1 3/1994
(Continued)

OTHER PUBLICATIONS

European Search Report dated Mar. 20, 2006.

(Continued)

*Primary Examiner* — David Ometz
*Assistant Examiner* — Quang V Le
(74) *Attorney, Agent, or Firm* — Robert D. Shedd; Patricia A. Verlangieri

(57) ABSTRACT

A method for reading data from a holographic storage medium is described. An image sensor is used for acquiring data. The holographic storage medium, which contains binary information in the form of at least one two-dimensional data page, is illuminated by means of a laser beam bundle and the retrieved data page is read out by means of the image sensor, for which purpose the latter is provided with an activatable area having a multiplicity of pixels. It achieves the object of configuring a method of this type in such a way that the read-out of the information is accelerated with a number of pixels remaining the same. For this purpose, the activatable area of the image sensor is subdivided into different regions which are in each case assigned to a region having a specific intensity of the light beam. In this case, a longer exposure time and/or a higher sensitivity are/is determined for regions assigned to regions having lower intensity than for regions assigned to regions having a higher intensity.

5 Claims, 2 Drawing Sheets

U.S. PATENT DOCUMENTS

2005/0134948 A1 6/2005 Waldman et al.
2006/0221218 A1* 10/2006 Adler et al. .................. 348/266

FOREIGN PATENT DOCUMENTS

| EP | 1531464 A2 | 5/2005 |
|---|---|---|
| JP | 05-075931 | 3/1993 |
| JP | 5308576 | 11/1993 |
| JP | 08-314364 | 11/1996 |
| JP | 10-97792 | 4/1998 |
| JP | 11195245 | 7/1999 |
| JP | 2002-344811 A | 11/2002 |
| WO | WO9517748 | 6/1995 |

OTHER PUBLICATIONS

Lacaita A. et al.: "Germanium quad-cell for single photon detection in the near infrared" Proceedings of the SPIE, SPIE, Bellingham, VA US Bd. 2550 Jul. 11, 1995, Seiten 274-283, XP002179902 ISSN: 0277-786X.

\* cited by examiner

METHOD FOR ACQUIRING DATA BY MEANS OF AN IMAGE SENSOR

This application claims the benefit, under 35 U.S.C. §119 of European Patent Application 05109991.9, filed Oct. 26, 2005.

FIELD OF THE INVENTION

The invention relates to a method for acquiring data by means of an image sensor, in particular data from a holographic storage system, and to an image sensor for such a method.

BACKGROUND OF THE INVENTION

Image sensors of this type have, as the central component, a two-dimensional charge-coupled semiconductor component formed in rows or as a matrix and serving for processing electrical and optical signals. The image sensor records the information in the form of data by detecting light radiation (object light) and generating electrical charges and forwards the latter. For this purpose, it has an array of up to a few million pixels (gate electrodes) that convert the received light into electrical signals. Moreover, an analogue/digital storage device converts said electrical signals into digital signals which are directly available and are stored in data storage units.

Image sensors of this type are also used in optical, in particular holographic, storage systems in which information is stored in the form of data pages in a two-dimensional data area or a three-dimensional data volume of a storage medium (disc, card), in order to retrieve and acquire stored data by exposing the storage medium using a laser beam bundle.

In general, laser beam bundles have an inhomogeneous, in particular Gaussian, intensity distribution associated with an inhomogeneous exposure of the data page impinged upon on the storage medium, an inhomogeneous contrast resulting from this exposure on said data page, and consequently also an inhomogeneous intensity distribution on the image sensor activated during an exposure. This is regarded as disadvantageous since the read-out of the information contained in the data page is effected simultaneously by the image sensor and takes longer in the lower-contrast zones, which is associated with an increase in the exposure time.

SUMMARY OF THE INVENTION

It is an object of the invention to propose a method for acquiring data from a holographic storage medium by means of an image sensor according to the preamble of Claim 1, which allows to accelerate the read-out of the information with the number of pixels remaining the same. A further object of the invention is to propose an apparatus for reading from and/or writing to a holographic storage medium having an image sensor suitable for the method.

This object is achieved, in the case of a method according to the preamble of Claim 1, by means of characterizing features of Claim 1. Advantageous configurations are presented in the subclaims.

The invention consists in the further development of a known method for acquiring data by means of an image sensor. In this case, the image sensor is a semiconductor component, preferably a CMOS image sensor or else a CCD image sensor. In the case of this method, a holographic storage medium containing binary information in at least one two-dimensional data page is exposed by means of a laser beam bundle. The exposed data page is read out by means of the image sensor having a two-dimensional activated area in a predetermined time. It is now proposed to subdivide the active (or activatable) zone of the image sensor into different regions to which different properties are assigned depending on the exposure intensity and the contrast on the data page, brought about by the inhomogeneous intensity distribution of the laser beam bundle. The properties are preferably different exposure times or different sensitivities. An active zone of the image sensor having a longer exposure time or a higher sensitivity is assigned to a region on the data page having a lower exposure intensity and accordingly a lower contrast. An active zone of the image sensor having a lower exposure time or a lower sensitivity is assigned to a region having a higher exposure intensity and a higher contrast. It goes without saying that it is also possible to combine different exposure times with different sensitivities.

The advantage resides in the fact that in the case of different exposure times, the data read-out can be effected earlier in the zones having a high exposure intensity than in the zones having a lower exposure intensity, and hence the data processing as well. Therefore, the method may be carried out in such a way that the active zones having the shorter exposure time are already read when the active zones having the longer exposure time are still being exposed. The data transfer becomes more efficient. The number of pixels does not need to be increased. In the case of different sensitivities, the data read-out can be effected simultaneously in all zones. In this case, the required exposure time is shorter than in the case of a conventional image sensor, so that the data read-out is accelerated.

The different regions are formed according to the intensity distribution of the laser beam bundle and thus also in a manner dependent on the optical axis. In this case, the regions near the optical axis have a shorter exposure time or a lower sensitivity than the regions more remote from the axis. The form of the regions depends on the intensity distribution of the laser beam bundle. The boundaries of a region preferably follow a specific intensity of the laser beam bundle. In the simplest configuration, an inner region near the optical axis is square or rectangular. In a configuration adapted to an elliptical intensity distribution, an inner region is preferably circular or elliptical. This is approximated for example by different rectangular or square regions connected to one another. The regions are advantageously defined in such a way that a first region is assigned all the pixels which lie with at least a defined proportion within a region of the laser beam bundle in which a first light intensity is exceeded. A second region is assigned all the pixels which lie with at least a defined proportion within a region of the laser beam bundle in which a second, lower light intensity is exceeded, and which have not already been assigned to the first region. Further regions are correspondingly defined as required.

In accordance with a further aspect of the invention, the regions are read spirally from the inside to the outside after a simultaneous exposure start, that is to say after simultaneous activation. In this case, too, the regions are exposed for different lengths of time, those in the centre shorter than those lying further outward. This form of read-out is advantageous particularly if the image sensor is subdivided into a multiplicity of very small regions. In this case, the smallest possible region is an individual pixel. In this case, the read-out spiral is advantageously rectangular or rounded. This is geometrically simpler to realize than an as exact approximation as possible to an ideal spiral.

BRIEF DESCRIPTION OF THE DRAWINGS

The invention is explained on the basis of an exemplary embodiment. In the associated drawings.

DETAILED DESCRIPTION OF PREFERRED EMBODIMENTS

Figure 1:
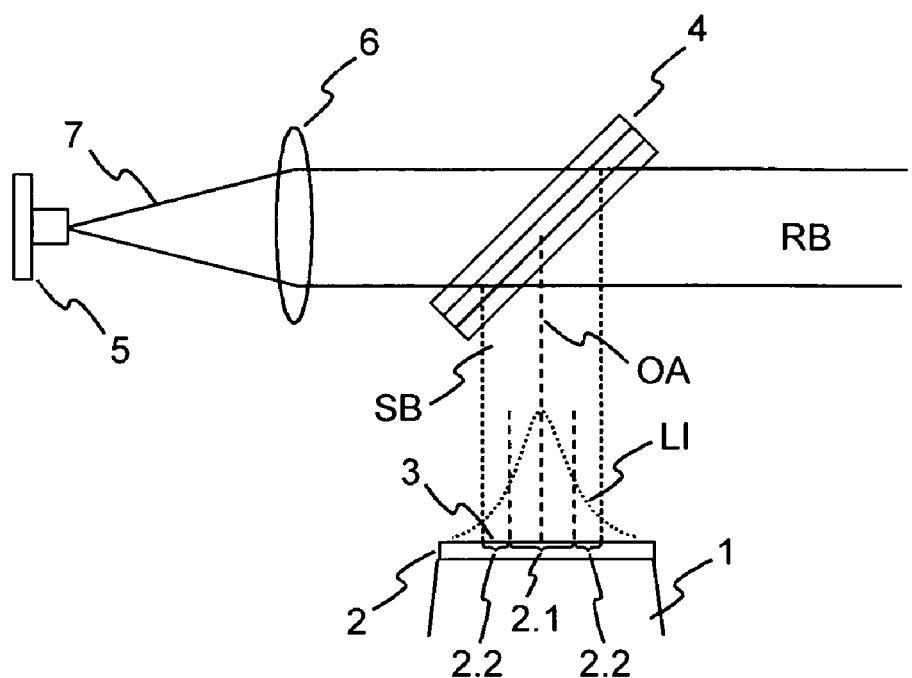
FIG. 1 shows an arrangement comprising a camera having an image sensor for carrying out the method.

The arrangement shown in FIG. 1 has a camera 1 having a CMOS image sensor 2 having an active (or activatable) area 3, facing an optical (holographic) storage medium 4, and a laser 5. The latter is assigned a converging lens 6, which focuses the laser beams 7 emitted by the laser 5 to form a reference beam bundle RB. A signal beam bundle SB is generated from the reference beam bundle RB by means of the holographic storage medium 4. By means of the signal beam bundle SB, the information contained and previously introduced in the storage medium 4 is imaged on the image sensor and can be read out. FIG. 1 also reveals the distribution of the light intensity LI on the activated area of the image sensor, which results from an inhomogeneous, in particular Gaussian, intensity distribution of the laser beam bundle. Depending on the light intensity LI on the activated area of the image sensor, different regions (2.1, 2.2) are assigned to said area.

In the example of FIG. 1, the reference beam bundle RB impinges on the storage medium 4 at an angle of 45°. However, other angles for example 90°, are also possible. Furthermore, storage media that are read in reflection rather than in transmission are also known.

Figure 2:
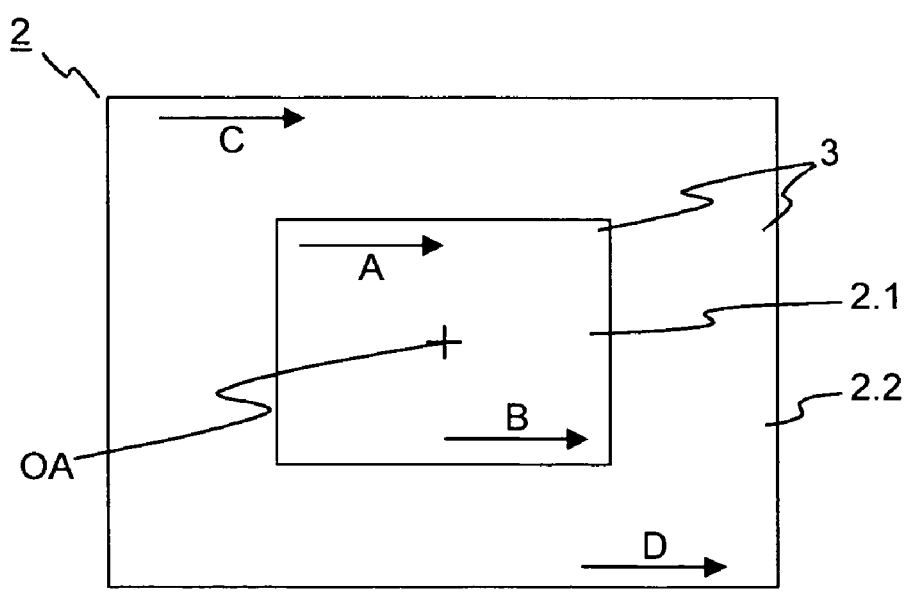
FIG. 2 shows the active region of the image sensor used.
Figure 3:
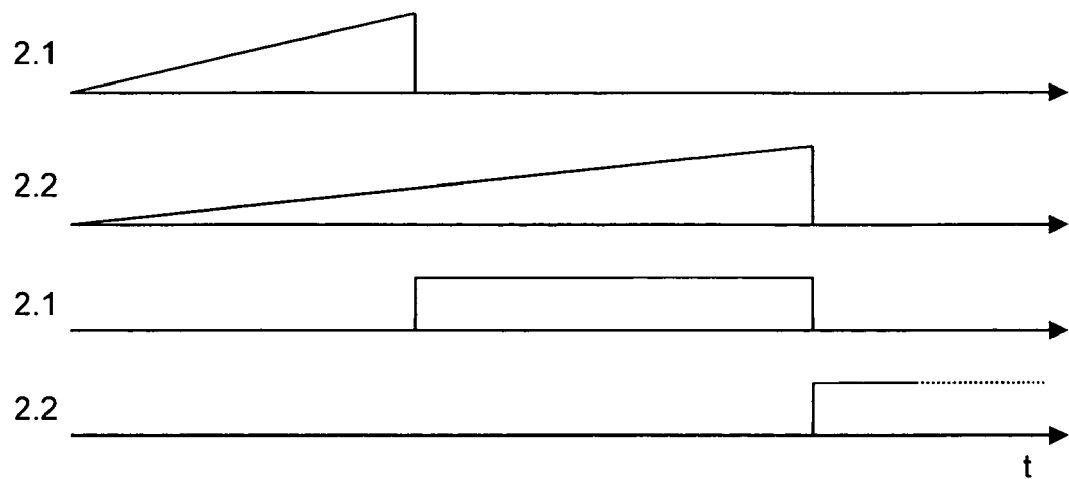
FIG. 3 shows a timing diagram thereof.

In the activatable area 3 of the image sensor 2 as shown in FIG. 2 there are formed a region 2.1 for a short exposure time or a low sensitivity, said region 2.1 being formed in rectangular fashion and lying in the region of the optical axis OA of the arrangement, and a region 2.2—surrounding said region 2.1 and remote from the axis—for a longer exposure time or a higher sensitivity. The arrows indicate the data read-out direction and the line sequence A to C of the data recording. In this case, both regions 2.1 and 2.2 are activated simultaneously and begin simultaneously to convert the optical information received into electrical signals. In the case of different exposure times, the exposure time in the region 2.1 is determined as shorter on account of the higher contrast on the data page stored in the storage medium 4 and amounts for example to half the exposure time of the exposure region 2.2. Furthermore, after the end of the exposure time in the region 2.1 the data evaluation can be begun while the region 2.2 is still being exposed. This temporal sequence is illustrated schematically in FIG. 3, the signal strength of the regions being illustrated in the upper part and the read-out time period being illustrated in the lower part. In the case of different sensitivities, the data evaluation is effected simultaneously in both regions 2.1, 2.2. It goes without saying that the image sensor may also have more than two regions.

Figure 4:
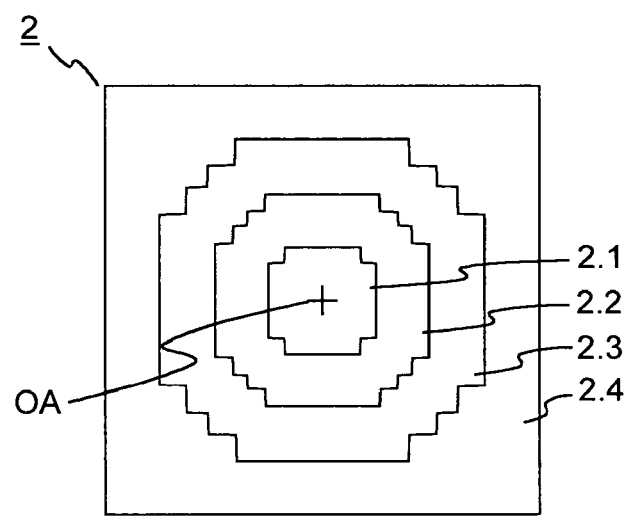
FIG. 4 shows a further example of the active region of an image sensor.

FIG. 4 shows a further example of the active region of an image sensor. In this case, the image sensor has four regions 2.1, 2.2, 2.3, 2.4 adapted to a circular Gaussian intensity distribution. The circular or annular regions that are actually required are approximated in this case by rectangular and square regions connected to one another.

LIST OF REFERENCE SYMBOLS

1 Camera
2 Image sensor
2.1 Region
2.2 Region
2.3 Region
2.4 Region
3 Area
4 Storage medium
5 Laser
6 Converging lens
7 Laser beam
A-C Line
LI Light intensity
OA Optical axis
RB Reference beam bundle
SB Signal beam bundle

What is claimed is:

1. A method for acquiring data from a holographic storage medium by means of an image sensor having an activatable area having a multiplicity of pixels,
    wherein the holographic storage medium contains binary information in the form of at least one two dimensional data page, and
    wherein the data page is retrieved from the holographic storage medium by means of a laser beam bundle and the retrieved data page is read out by means of the image sensor,
    wherein the activatable area is subdivided, into two or more continuous data regions containing a multiplicity of pixels, the data regions being read separately from one another with different parameters and reading of the data regions is started simultaneously,
    wherein different data regions are exposed for different lengths of time before they are read, and
    wherein the data regions having a short exposure time are already read when the data regions having a long exposure time are still being illuminated.

2. A method according to claim 1, wherein the data regions are read spirally from the inside to the outside or from the outside to the inside.

3. A method according to claim 1, wherein the different data regions have different light sensitivities.

4. An apparatus for reading from and/or writing to holographic storage media, with an image sensor having an activatable area having a multiplicity of pixels for reading out information contained in a light beam,
    wherein the activatable area of the image sensor is subdivided into two or more continuous data regions containing a multiplicity of pixels, the data regions being adapted to read with different properties and reading of the data regions is started simultaneously,
    wherein the two or more data regions are each assigned to a region of the retrieved data page having a specific intensity, wherein the different properties are different exposure times and/or different sensitivities and a data region of the image sensor having a short exposure time and/or a low sensitivity is assigned to a region of the light beam having a high intensity, and a data region of the image sensor having a long exposure time and/or high sensitivity is assigned to a region of the light beam having a low intensity.

5. An apparatus according to claim 4, wherein the image sensor is a CMOS image sensor or a CCD image sensor.

* * * * *